(12) United States Patent
Wei et al.

(10) Patent No.: US 9,190,565 B2
(45) Date of Patent: Nov. 17, 2015

(54) LIGHT EMITTING DIODE

(71) Applicants: Tsinghua University, Beijing (CN);
HON HAI PRECISION INDUSTRY CO., LTD., New Taipei (TW)

(72) Inventors: Yang Wei, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/316,742

(22) Filed: Jun. 26, 2014

(65) Prior Publication Data

US 2014/0306255 A1    Oct. 16, 2014

Related U.S. Application Data

(63) Continuation of application No. 13/689,730, filed on Nov. 29, 2012, now Pat. No. 8,823,044.

(51) Int. Cl.
| | |
|---|---|
| *H01L 33/00* | (2010.01) |
| *H01L 33/10* | (2010.01) |
| *H01L 33/36* | (2010.01) |
| *H01L 33/02* | (2010.01) |
| *B82Y 99/00* | (2011.01) |
| *H01L 33/40* | (2010.01) |

(52) U.S. Cl.
CPC .............. *H01L 33/10* (2013.01); *H01L 33/02* (2013.01); *H01L 33/36* (2013.01); *B82Y 99/00* (2013.01); *H01L 33/405* (2013.01); *Y10S 977/734* (2013.01)

(58) Field of Classification Search
CPC .............................. H01L 25/167; H01L 33/10
USPC ..................... 257/99, 9, E29.086; 438/478
See application file for complete search history.

(56) References Cited

U.S. PATENT DOCUMENTS

| | | | | |
|---|---|---|---|---|
| 6,051,849 | A * | 4/2000 | Davis et al. | 257/103 |
| 2008/0070413 | A1 | 3/2008 | Chen et al. | |
| 2011/0163298 | A1 | 7/2011 | Sung | |
| 2011/0241072 | A1* | 10/2011 | Wang et al. | 257/190 |
| 2012/0141799 | A1* | 6/2012 | Kub et al. | 428/408 |
| 2012/0325139 | A1 | 12/2012 | Wei et al. | |

FOREIGN PATENT DOCUMENTS

| | | |
|---|---|---|
| CN | 102201503 | 9/2011 |
| CN | 102254584 | 11/2011 |
| CN | 102263171 | 11/2011 |
| TW | 200816508 | 4/2008 |
| TW | 201136769 | 11/2011 |
| WO | 2011094597 | 8/2011 |

\* cited by examiner

*Primary Examiner* — Matthew Gordon
(74) *Attorney, Agent, or Firm* — Novak Druce Connolly Bove +Quigg LLP

(57) ABSTRACT

A light emitting diode includes a substrate, graphene layer, a first semiconductor layer, an active layer, a second semiconductor layer, a first electrode and a second electrode. The first semiconductor layer is on the epitaxial growth surface of the substrate. The active layer is between the first semiconductor layer and the second semiconductor layer. The first electrode is electrically connected with the second semiconductor layer and the second electrode electrically is connected with the second part of the carbon nanotube layer. The graphene layer is located between the active layer and the first semiconductor layer.

17 Claims, 18 Drawing Sheets

_US 9,190,565 B2_

LIGHT EMITTING DIODE

This application is a continuation application of U.S. patent application Ser. No. 13/689,730, filed on Nov. 29, 2012, entitled "LIGHT EMITTING DIODE," which claims all benefits accruing under 35 U.S.C. §119 from China Patent Applications: Application No. 201210122505.6, filed on Apr. 25, 2012 in the China Intellectual Property Office, disclosures of which are incorporated herein by references.

BACKGROUND

1. Technical Field

The present disclosure relates to a light emitting diode (LED) and a method for making the same.

2. Description of the Related Art

LEDs are semiconductors that convert electrical energy into light. Compared to conventional light sources, the LEDs have higher energy conversion efficiency, higher radiance (i.e., LEDs emit a larger quantity of light per unit area than conventional light sources), longer lifetime, higher response speed, and better reliability. At the same time, LEDs generate less heat. Therefore, LED modules are widely used as light sources in optical imaging systems, such as displays, projectors, and so on.

A conventional LED commonly includes an N-type semiconductor layer, a P-type semiconductor layer, an active layer, an N-type electrode, and a P-type electrode. The active layer is located between the N-type semiconductor layer and the P-type semiconductor layer. The P-type electrode is located on the P-type semiconductor layer. The N-type electrode is located on the N-type semiconductor layer. Typically, the P-type electrode is transparent. In operation, a positive voltage and a negative voltage are applied respectively to the P-type semiconductor layer and the N-type semiconductor layer. Thus, holes in the P-type semiconductor layer and electrons in the N-type semiconductor layer can enter the active layer and combine with each other to emit visible light.

However, extraction efficiency of LEDs is low because typical semiconductor materials have a higher refraction index than that of air. Large-angle light emitted from the active layer may be internally reflected in LEDs, so that a large portion of the light emitted from the active layer remains in the LEDs, thereby degrading the extraction efficiency.

What is needed, therefore, is a light emitting diode and a method for making the same, which can overcome the above-described shortcomings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
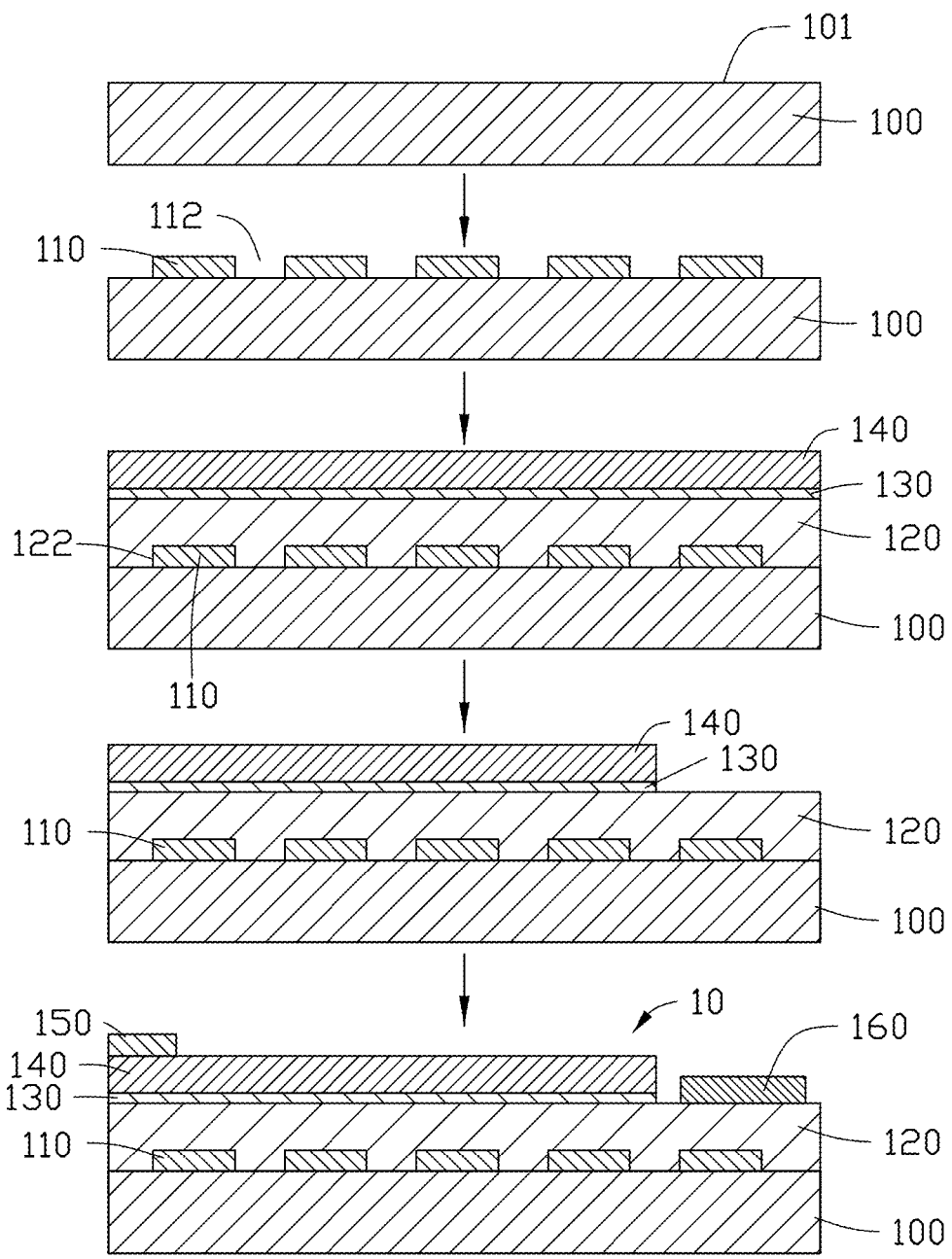
FIG. 1 is a flowchart of one embodiment a method for manufacturing a LED.

Referring to FIG. 1, a method of one embodiment for manufacturing a light emitting diode (LED) 10 includes the following steps:

step (10), providing a substrate 100 having an epitaxial growth surface 101;

step (20), applying a graphene layer 110 on the epitaxial growth surface 101;

step (30), growing a semiconductor epitaxial layer 104 including a first semiconductor layer 120, an active layer 130 and a second semiconductor layer 140;

step (40), exposing a part of the first semiconductor layer 120 by etching the semiconductor epitaxial layer 104; and step (50), applying a first electrode 150 on the second semiconductor layer 140 and a second electrode 160 on the exposed part of the first semiconductor layer 120.

In step (10), the epitaxial growth surface 101 is used to grow the semiconductor epitaxial layer 104. The epitaxial growth surface 101 is a very smooth surface. Oxygen and carbon are removed from the surface. The substrate 100 can be a single layer structure or a multiple layer structure. If the substrate 100 is a single layer structure, the substrate 100 can be a single-crystal structure. The single-crystal structure includes a crystal face which is used as the epitaxial growth surface 101. The material of the substrate 100 can be SOI (Silicon on insulator), $LiGaO_2$, $LiAlO_2$, $Al_2O_3$, Si, GaAs, GaN, GaSb, InN, InP, InAs, InSb, AlP, AlAs, AlSb, AlN, GaP, SiC, SiGe, GaMnAs, GaAlAs, GaInAs, GaAlN, GaInN, AlInN, GaAsP, InGaN, AlGaInN, AlGaInP, GaP:Zn or GaP:N. The material of the substrate 100 is not limited, as long as the substrate 100 has an epitaxial growth surface 101 on which N-type semiconductor layer 106 can grow. If the substrate 100 is a multiple layer structure, the substrate 100 should include at least one layer of the single-crystal structure mentioned previously. The material of the substrate 100 can be selected according to N-type semiconductor layer 106. In one embodiment, the lattice constant and thermal expansion coefficient of the substrate 100 is similar to N-type semiconductor layer 106 thereof in order to improve the quality of N-type semiconductor layer 106. In another embodiment, the material of the substrate 100 is sapphire. The thickness, shape, and size of the substrate 100 are arbitrary and can be selected according to need.

In step (20), the graphene layer 110 can include graphene powders or at least one graphene film. The graphene powders include a plurality of dispersed graphene grains. The graphene film, namely a single-layer graphene, is a single layer of continuous carbon atoms. The single-layer graphene is a nanometer-thick two-dimensional analog of fullerenes and carbon nanotubes. When the graphene layer 110 includes graphene powders, the graphene powders can be formed into a patterned structure by the process of dispersion, coating and etching. When the graphene layer 110 includes the at least one graphene film, a plurality of graphene films can be stacked on each other or arranged coplanar side by side. The graphene film can be patterned by cutting or etching. The thickness of the graphene layer 110 can be in a range from about 1 nanometer to about 100 micrometers. For example, the thickness of the graphene layer 110 can be 1 nanometer, 10 nanometers, 200 nanometers, 1 micrometer, or 10 micrometers. The single-layer graphene can have a thickness of a single carbon atom. In one embodiment, the graphene layer 110 is a pure graphene structure consisting of graphene.

The single-layer graphene has very unique properties. The single-layer graphene is almost completely transparent. The single-layer graphene absorbs only about 2.3% of visible light and allows most of the infrared light to pass through. The thickness of the single-layer graphene is only about 0.34 nanometers. A theoretical specific surface area of the single-layer graphene is 2630 $m^2 \cdot g^{-1}$. The tensile strength of the single-layer graphene is 125 GPa, and the Young's modulus of the single-layer graphene can be as high as 1.0 TPa. The thermal conductivity of the single-layer graphene is measured at 5300 $W \cdot m^{-1} \cdot K^{-1}$. A theoretical carrier mobility of the single-layer graphene is $2 \times 10^5$ $cm^2 \cdot V^{-1} \cdot s^{-1}$. A resistivity of the single-layer graphene is $1 \times 10^{-6}$ $\Omega \cdot cm$ which is about ⅔ of a resistivity of copper. Phenomenon of quantum Hall effects and scattering-free transmissions can be observed on the single-layer graphene at room temperature.

Figure 2:
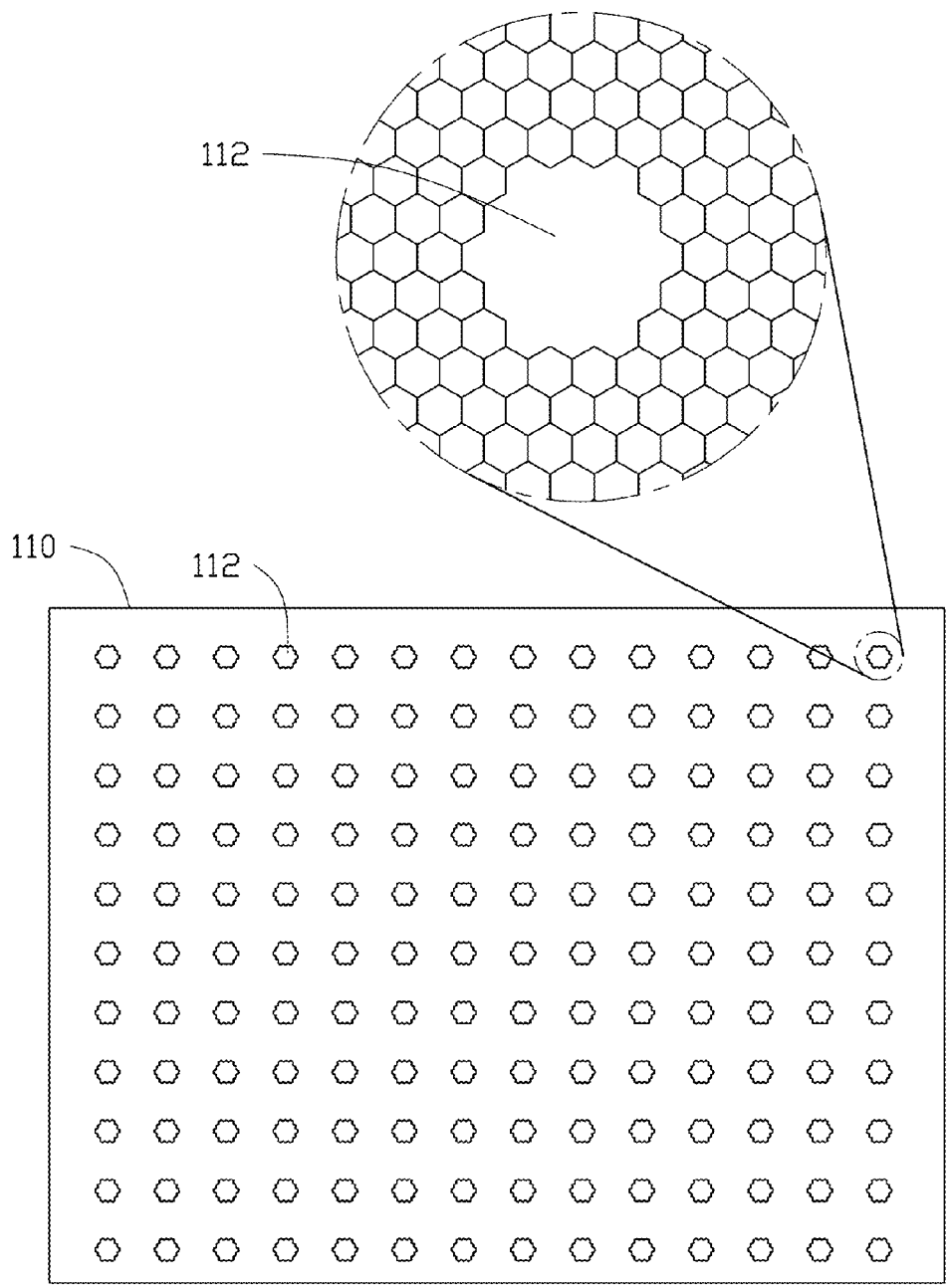
FIG. 2 is a schematic view of one embodiment of a graphene layer having a plurality of hole shaped apertures.
Figure 3:
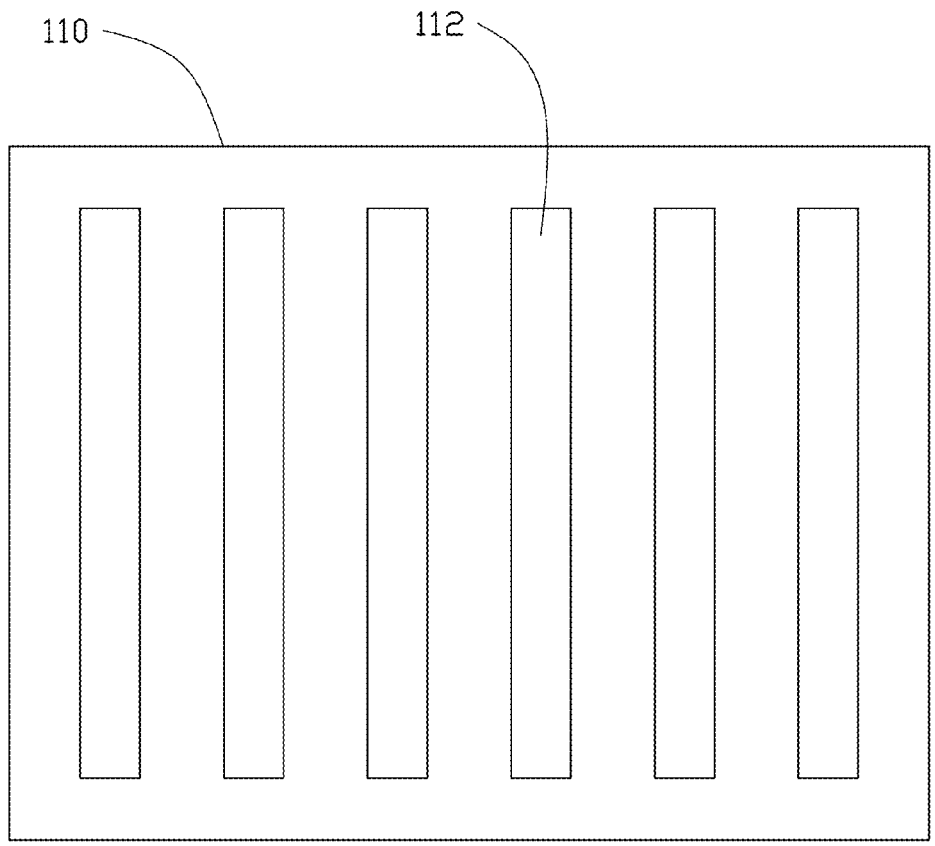
FIG. 3 is a schematic view of one embodiment of a graphene layer having a plurality of rectangular shaped apertures.
Figure 4:
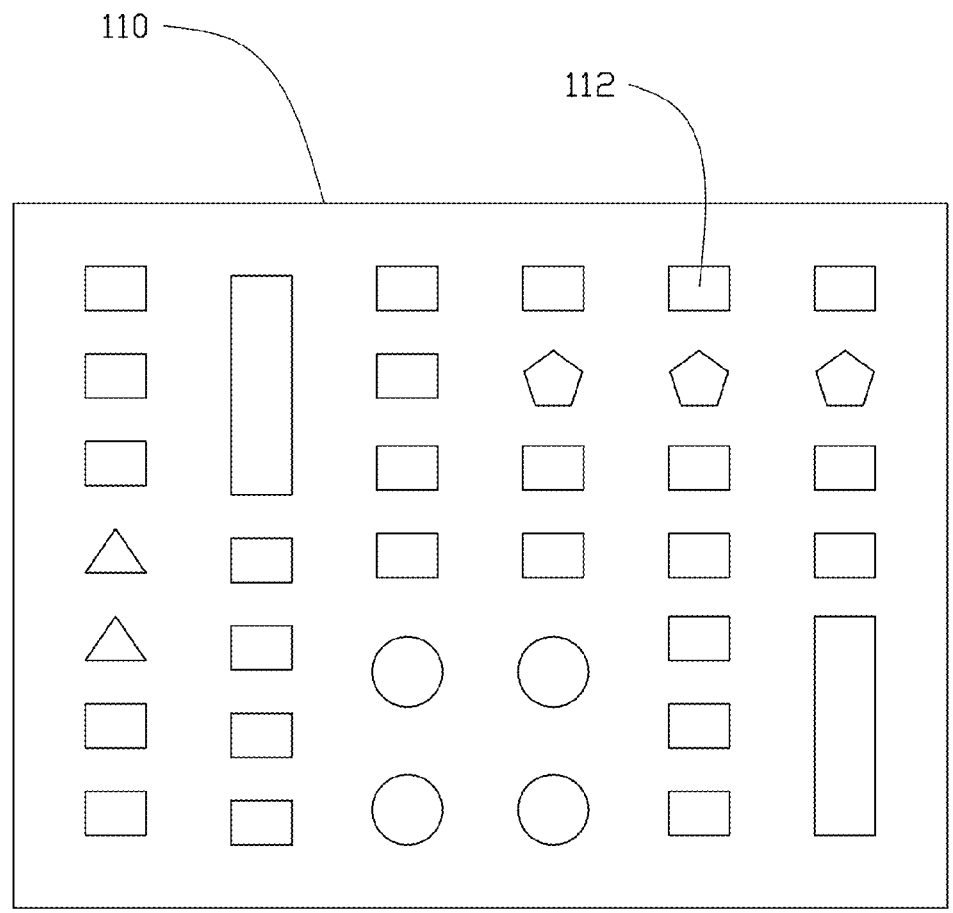
FIG. 4 is a schematic view of one embodiment of a graphene layer having apertures of different shapes.

In one embodiment, the graphene layer 110 is a patterned structure. As shown in FIGS. 2-4, the term "patterned structure" means the graphene layer 110 is a continuous structure and defines a plurality of apertures 112. When the graphene layer 110 is located on the epitaxial growth surface 101, part of the epitaxial growth surface 101 is exposed from the apertures 112 to grow the semiconductor epitaxial layer 104.

The shape of the aperture 112 is not limited and can be round, square, triangular, diamond or rectangular. The graphene layer 110 can have the apertures 112 of all the same shape or of different shapes. The apertures 112 can be dispersed uniformly on the grapheme layer 102. Each of the apertures 112 extends through the graphene layer 110 along the thickness direction. The apertures 112 can be hole shaped as shown in FIG. 2 or rectangular shaped as shown in FIG. 3. Alternatively, the apertures 112 can be a mixture of hole shaped and rectangular shaped in the patterned graphene layer 110, as shown in FIG. 4. Hereafter, the size of the aperture 112 is the diameter of the hole or width of the rectangular. The sizes of the apertures 112 can be different. The average size of the apertures 112 can be in a range from about 10 nanometers to about 500 micrometers. For example, the sizes of the apertures 112 can be about 50 nanometers, 100 nanometers, 500 nanometers, 1 micrometer, 10 micrometers, 80 micrometers, or 120 micrometers. The smaller the sizes of the apertures 112, the less dislocation defects will occur during the process of growing the semiconductor epitaxial layer 104. In one embodiment, the sizes of the apertures 112 are in a range from about 10 nanometers to about 10 micrometers. A dutyfactor of the graphene layer 110 is an area ratio between the sheltered epitaxial growth surface 101 and the exposed epitaxial growth surface 101. The dutyfactor of the graphene layer 110 can be in a range from about 1:100 to about 100:1. For example, the dutyfactor of the graphene layer 110 can be about 1:10, 1:2, 1:4, 4:1, 2:1, or 10:1. In one embodiment, the dutyfactor of the graphene layer 110 is in a range from about 1:4 to about 4:1.

Figure 5:
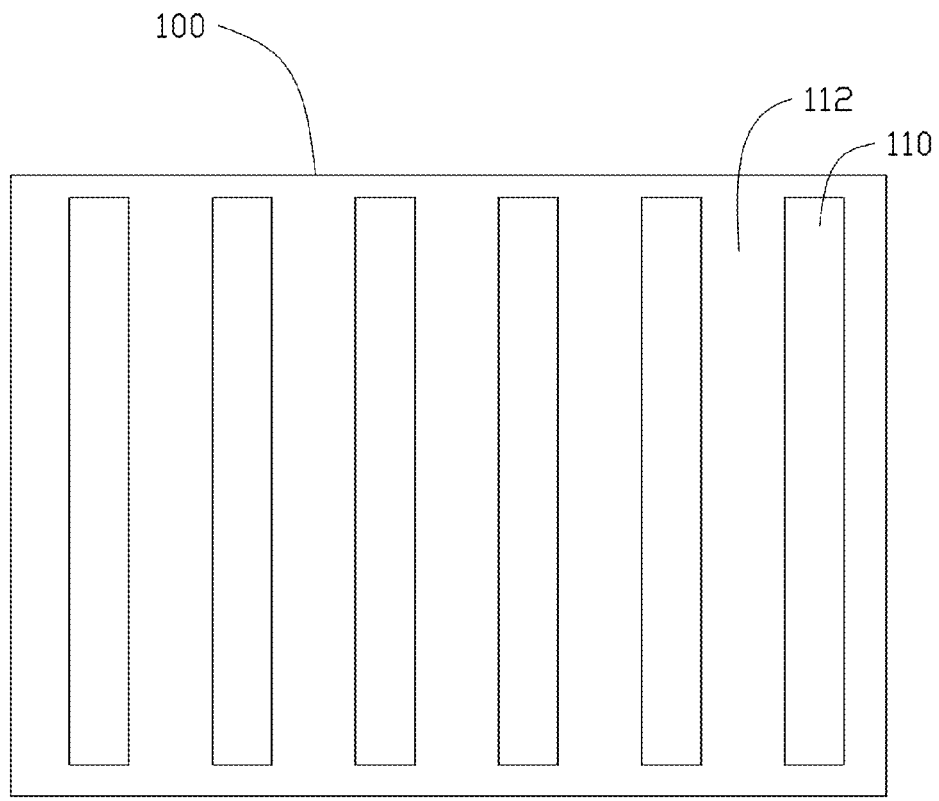
FIG. 5 is a schematic view of one embodiment of a plurality of sub graphene layers spaced from each other.

As shown in FIG. 5, the term "patterned structure" can also be a plurality of patterned graphene layers spaced from each other. The aperture 112 is defined between adjacent two of the patterned graphene layers. When the graphene layer 110 is located on the epitaxial growth surface 101, part of the epitaxial growth surface 101 is exposed from the aperture 112 to grow the semiconductor epitaxial layer 104. In one embodiment, the graphene layer 110 includes a plurality of graphene strips placed in parallel with each other and spaced from each other as shown in FIG. 5.

The graphene layer 110 can be grown on the epitaxial growth surface 101 directly, by transfer printing a preformed graphene film, or by filtering and depositing a graphene suspension with graphene powders dispersed therein. The graphene film can be made by chemical vapor deposition, exfoliating graphite, electrostatic deposition, pyrolysis of silicon carbide, epitaxial growth on silicon carbide, or epitaxial growth on metal substrates. The graphene powders can be made by graphite oxide reduction, pyrolysis of sodium ethoxide, cutting carbon nanotube, carbon dioxide reduction method, or sonicating graphite.

In one embodiment, the graphene layer 110 of FIG. 2 can be made by following steps:

step (201), providing a graphene film;

step (202), transferring the graphene film on the epitaxial growth surface 101 of the substrate 100; and step (203), patterning the graphene film.

In step (201), the graphene film is made by chemical vapor deposition which includes the steps of: (a1) providing a substrate; (b1) depositing a metal catalyst layer on the substrate; (c1) annealing the metal catalyst layer; and (d1) growing the graphene film in a carbon source gas.

In step (a1), the substrate can be a copper foil or a $Si/SiO_2$ wafer. The $Si/SiO_2$ wafer can have a Si layer with a thickness in a range from about 300 micrometers to about 1000 micrometers and a $SiO_2$ layer with a thickness in a range from about 100 nanometers to about 500 nanometers. In one embodiment, the $Si/SiO_2$ wafer has a Si layer with a thickness of about 600 micrometers and a $SiO_2$ layer with a thickness of about 300 nanometers.

In step (b1), the metal catalyst layer can be made of nickel, iron, or gold. The thickness of the metal catalyst layer can be in a range from about 100 nanometers to about 800 nanometers. The metal catalyst layer can be made by chemical vapor deposition, physical vapor deposition, such as magnetron sputtering or electron beam deposition. In one embodiment, a metal nickel layer of about 500 nanometers is deposited on the $SiO_2$ layer.

In step (c1), the annealing temperature can be in a range from about 900° C. to about 1000° C. The annealing can be performed in a mixture of argon gas and hydrogen gas. The flow rate of the argon gas is about 600 sccm, and the flow rate of the hydrogen gas is about 500 sccm. The annealing time is in a range from about 10 minutes to about 20 minutes.

In step (d1), the growth temperature is in a range from about 900° C. to about 1000° C. The carbon source gas is methane. The growth time is in a range from about 5 minutes to about 10 minutes.

In step (202), the transferring the graphene film includes the steps of: (a2) coating an organic colloid or polymer on the surface of the graphene film as a supporter; (b2) baking the organic colloid or polymer on the graphene film; (c2) immersing the baked graphene film with the Si/SiO$_2$ substrate in deionized water so that the metal catalyst layer and the SiO$_2$ layer are separated to obtain a supporter/graphene film/metal catalyst layer composite; (d2) removing the metal catalyst layer from the supporter/graphene film/metal catalyst layer composite to obtain a supporter/graphene film composite; (e2) placing the supporter/graphene film composite on the epitaxial growth surface 101; (f2) fixing the graphene film on the epitaxial growth surface 101 firmly by heating; and (g2) removing the supporter.

In step (a2), the supporter material is poly(methyl methacrylate) (PMMA), polydimethylsiloxane, positive photoresist 9912, or photoresist AZ5206.

In step (b2), the baking temperature is in a range from about 100° C. to about 185° C.

In step (c2), an ultrasonic treatment on the metal catalyst layer and the SiO$_2$ layer can be performed after being immersed in deionized water.

In step (d2), the metal catalyst layer is removed by chemical liquid corrosion. The chemical liquid can be nitric acid, hydrochloric acid, ferric chloride (FeCl$_3$), and ferric nitrate (Fe(NO$_3$)$_3$).

In step (g2), the supporter is removed by soaking the supporter in acetone and ethanol first, and then heating the supporter to about 400° C. in a protective gas.

In step (203), the method of patterning the graphene film can be photocatalytic titanium oxide cutting, ion beam etching, atomic force microscope etching, or the plasma etching. In one embodiment, an anodic aluminum oxide mask is placed on the surface of the graphene film, and then the graphene film is etched by a plasma. The anodic aluminum oxide mask has a plurality of micropores arranged in an array. The part of the graphene film corresponding to the micropores of the anodic aluminum oxide mask may be removed by the plasma etching, thereby obtaining a graphene layer 110 having a plurality of apertures.

In one embodiment, the graphene layer 110 of FIG. 5 can be made by following steps:

step (204), making a graphene suspension with graphene powder dispersed therein;

step (205), forming a continuous graphene coating on the epitaxial growth surface 101 of the substrate 100; and step (206), patterning the continuous graphene coating.

In step (204), the powder is dispersed in a solvent such as water, ethanol, N-methyl pyrrolidone, tetrahydrofuran, or 2-nitrogen dimethylacetamide. The graphene powder can be made by graphite oxide reduction, pyrolysis of sodium ethoxide, cutting carbon nanotube, carbon dioxide reduction method, or sonicating graphite. The concentration of the suspension can be in a range from about 1 mg/ml to about 3 mg/ml.

In step (205), the suspension can be coated on the pitaxial growth surface 101 of the substrate 100 by spinning coating. The rotating speed of spinning coating can be in a range from about 3000 r/min to about 5000 r/min. The time for spinning coating can be in a range from about 1 minute to about 2 minutes.

In step (206), the method of patterning the continuous graphene coating can be photocatalytic titanium oxide cutting, ion beam etching, atomic force microscope etching, or the plasma etching.

In one embodiment, photocatalytic titanium oxide cutting is used to pattern the continuous graphene coating. The method includes following steps:

step (2061), making a patterned metal titanium layer;

step (2062), heating and oxidizing the patterned metal titanium layer to obtain a patterned titanium dioxide layer;

step (2063), contacting the patterned titanium dioxide layer with the continuous graphene coating;

step (2064), irradiating the patterned titanium dioxide layer with ultraviolet light; and step (2065), removing the patterned titanium dioxide layer.

In step (2061), the patterned metal titanium layer can be formed by vapor deposition through a mask or photolithography on a surface of a quartz substrate. The thickness of the quartz substrate can be in a range from about 300 micrometers to about 1000 micrometers. The thickness of the metal titanium layer can be in a range from about 3 nanometers to about 10 nanometers. In one embodiment, the quartz substrate has a thickness of 500 micrometers, and the metal titanium layer has a thickness of 4 nanometers. The patterned metal titanium layer is a continuous titanium layer having a plurality of spaced stripe-shaped openings.

In step (2062), the patterned metal titanium layer is heated under conditions of about 500° C. to about 600° C. for about 1 hour to about 2 hours. The heating can be performed in a furnace.

In step (2064), the ultraviolet light has a wavelength of about 200 nanometers to about 500 nanometers. The patterned titanium dioxide layer is irradiated by the ultraviolet light in air or oxygen atmosphere with a humidity of about 40% to about 75%. The irradiating time is about 30 minutes to about 90 minutes. Because the titanium dioxide is a semiconductor material with photocatalytic property, the titanium dioxide can produce electrons and holes under ultraviolet light irradiation. The electrons will be captured by the Ti (IV) of the titanium surface, and the holes will be captured by the lattice oxygen. Thus, the titanium dioxide has strong oxidation-reduction ability. The captured electrons and holes are easy to oxidize and reduce the water vapor in the air to produce active substance such as O$_2$ and H$_2$O$_2$. The active substance can decompose the graphene material easily.

In step (2065), the patterned titanium dioxide layer can be removed by removing the quartz substrate. After removing the patterned titanium dioxide layer, the patterned graphene layer 110 can be obtained. The pattern of the patterned graphene layer 110 and the pattern of the patterned titanium dioxide layer are mutually engaged with each other. Namely, the part of the continuous graphene coating corresponding to the patterned titanium dioxide layer will be removed off.

In other embodiment, in step (2061), the patterned metal titanium layer can be formed by depositing titanium on a patterned carbon nanotube structure directly. The carbon nanotube structure can be a carbon nanotube film or a plurality of carbon nanotube wires. The plurality of carbon nanotube wires can be crossed or weaved together to form a carbon nanotube structure. The plurality of carbon nanotube wires can also be arranged in parallel and spaced from each other to form a carbon nanotube structure. Because a plurality of apertures is formed in the carbon nanotube film or between the carbon nanotube wires, the carbon nanotube structure can be patterned. The titanium deposited on the patterned carbon nanotube structure can form a patterned titanium layer. In step (2062), the patterned titanium layer can be heated by applying an electric current through the patterned carbon nanotube structure. In step (2064), the part of the continuous graphene coating corresponding to the patterned carbon nanotube structure will be removed off to form a plurality of apertures 112. Because the diameter of the carbon nanotube is about 0.5 nanometers to about 50 nanometers, the size of the apertures 112 can be several nanometers to tens nanometers. The size of the apertures 112 can be controlled by selecting the diameter of the carbon nanotube.

The carbon nanotube structure is a free-standing structure. The term "free-standing structure" means that the carbon nanotube structure can sustain the weight of itself when it is hoisted by a portion A thereof without any significant damage to its structural integrity. That is, the carbon nanotube structure can be suspended by two spaced supports. Thus, the process of patterning the continuous graphene coating can be operated as follow. For example, first, depositing titanium layer on a plurality of parallel carbon nanotube wires; second, heating and oxidizing the titanium layer on the plurality of carbon nanotube wires form titanium dioxide layer; third, arranging the plurality of carbon nanotube wires on the continuous graphene coating; fourth, irradiating the plurality of carbon nanotube wires with the ultraviolet light; last removing the plurality of carbon nanotube wires to obtain a graphene layer 110 having a plurality of rectangular shaped apertures 112.

Figure 6:
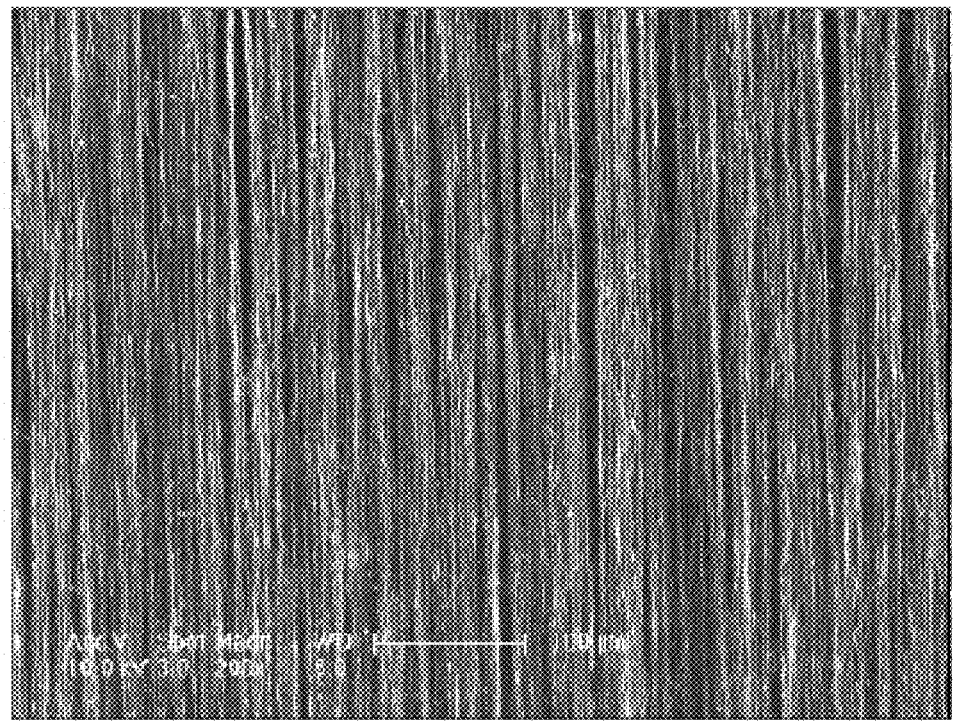
FIG. 6 is a Scanning Electron Microscope (SEM) image of a drawn carbon nanotube film.
Figure 7:
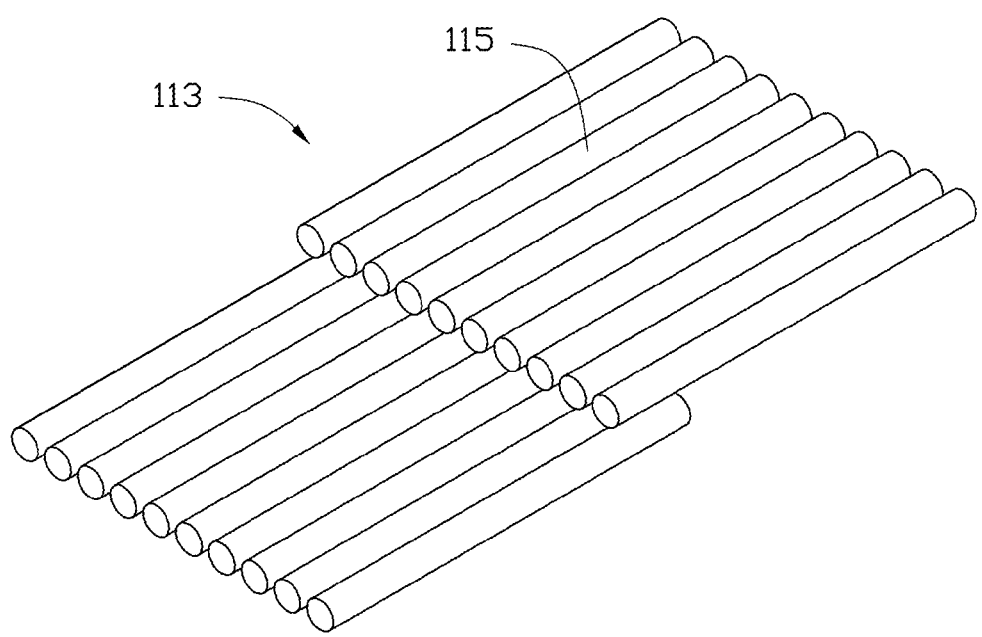
FIG. 7 is a schematic structural view of a carbon nanotube segment of the drawn carbon nanotube film of FIG. 6.

In one embodiment, the carbon nanotube structure includes at least one drawn carbon nanotube film. A drawn carbon nanotube film can be drawn from a carbon nanotube array that is able to have a film drawn therefrom. The drawn carbon nanotube film includes a plurality of successive and oriented carbon nanotubes joined end-to-end by van der Waals attractive force therebetween. The drawn carbon nanotube film is a free-standing film. Referring to FIGS. 6-7, each drawn carbon nanotube film includes a plurality of successively oriented carbon nanotube segments 113 joined end-to-end by van der Waals attractive force therebetween. Each carbon nanotube segment 113 includes a plurality of carbon nanotubes 115 parallel to each other, and combined by van der Waals attractive force therebetween. As can be seen in FIG. 6, some variations can occur in the drawn carbon nanotube film. The carbon nanotubes 115 in the drawn carbon nanotube film are oriented along a preferred orientation. The drawn carbon nanotube film can be treated with an organic solvent to increase the mechanical strength and toughness and reduce the coefficient of friction of the drawn carbon nanotube film. A thickness of the drawn carbon nanotube film can range from about 0.5 nanometers to about 100 micrometers. The drawn carbon nanotube film can be attached to the epitaxial growth surface 101 directly.

Figure 8:
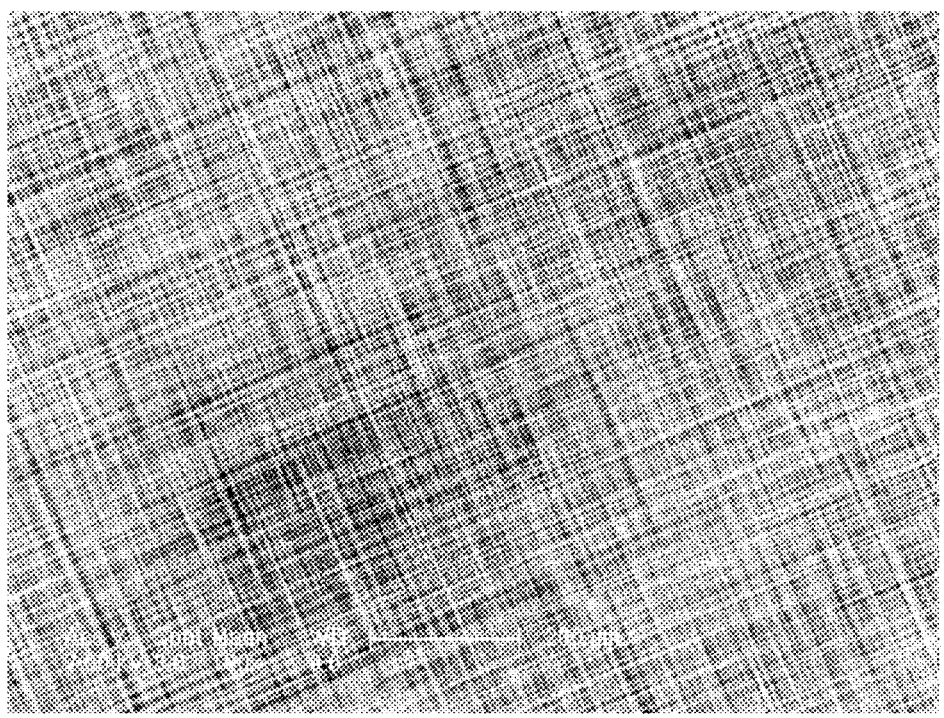
FIG. 8 is an SEM image of cross-stacked drawn carbon nanotube films.

The carbon nanotube structure can include at least two stacked drawn carbon nanotube films. In other embodiments, the carbon nanotube structure can include two or more coplanar carbon nanotube films, and can include layers of coplanar carbon nanotube films. Additionally, when the carbon nanotubes in the carbon nanotube film are aligned along one preferred orientation (e.g., the drawn carbon nanotube film), an angle can exist between the orientation of carbon nanotubes in adjacent films, whether stacked or adjacent. Adjacent carbon nanotube films can be combined by only the van der Waals attractive force therebetween. An angle between the aligned directions of the carbon nanotubes in two adjacent carbon nanotube films can range from about 0 degrees to about 90 degrees. When the angle between the aligned directions of the carbon nanotubes in adjacent stacked drawn carbon nanotube films is larger than 0 degrees, a plurality of micropores is defined by the carbon nanotube structure. Referring to FIG. 8, the carbon nanotube structure is shown with the aligned directions of the carbon nanotubes between adjacent stacked drawn carbon nanotube films at 90 degrees. Stacking the carbon nanotube films will also add to the structural integrity of the carbon nanotube structure.

A step of heating the drawn carbon nanotube film can be performed to decrease the thickness of the drawn carbon nanotube film. The drawn carbon nanotube film can be partially heated by a laser or microwave. The thickness of the drawn carbon nanotube film can be reduced because some of the carbon nanotubes will be oxidized. In one embodiment, the drawn carbon nanotube film is irradiated by a laser device in an atmosphere comprising of oxygen therein. The power density of the laser is greater than $0.1 \times 10^4$ watts per square meter. The drawn carbon nanotube film can be heated by fixing the drawn carbon nanotube film and moving the laser device at a substantially uniform speed to irradiate the drawn carbon nanotube film. When the laser irradiates the drawn carbon nanotube film, the laser is focused on the surface of the drawn carbon nanotube film to form a laser spot. The diameter of the laser spot ranges from about 1 micron to about 5 millimeters. In one embodiment, the laser device is carbon dioxide laser device. The power of the laser device is about 30 watts. The wavelength of the laser is about 10.6 micrometers. The diameter of the laser spot is about 3 millimeters. The velocity of the laser movement is less than 10 millimeters per second. The power density of the laser is $0.053 \times 10^{12}$ watts per square meter.

Figure 9:
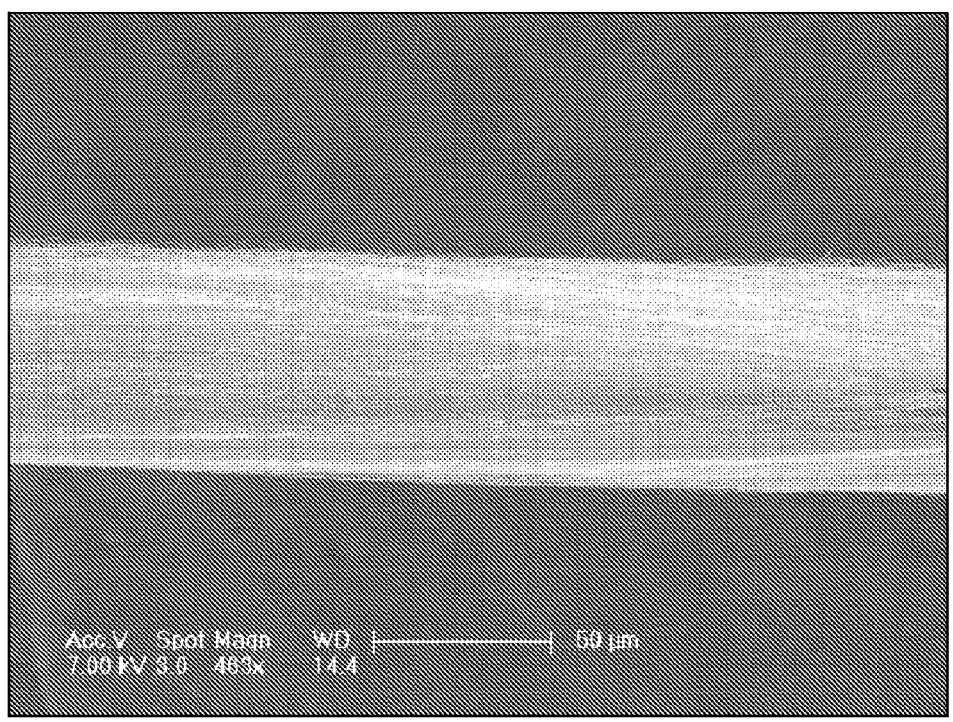
FIG. 9 is an SEM image of an untwisted carbon nanotube wire.

The carbon nanotube wire can be untwisted or twisted. Treating the drawn carbon nanotube film with a volatile organic solvent can form the untwisted carbon nanotube wire. Specifically, the organic solvent is applied to soak the entire surface of the drawn carbon nanotube film. During the soaking, adjacent parallel carbon nanotubes in the drawn carbon nanotube film will bundle together, due to the surface tension of the organic solvent as it volatilizes, and thus, the drawn carbon nanotube film will be shrunk into an untwisted carbon nanotube wire. Referring to FIG. 9, the untwisted carbon nanotube wire includes a plurality of carbon nanotubes substantially oriented along a same direction (i.e., a direction along the length of the untwisted carbon nanotube wire). The carbon nanotubes are substantially parallel to the axis of the untwisted carbon nanotube wire. More specifically, the untwisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. The carbon nanotube segments can vary in width, thickness, uniformity, and shape. The length of the untwisted carbon nanotube wire can be arbitrarily set as desired. A diameter of the untwisted carbon nanotube wire ranges from about 0.5 nanometers to about 100 micrometers.

Figure 10:
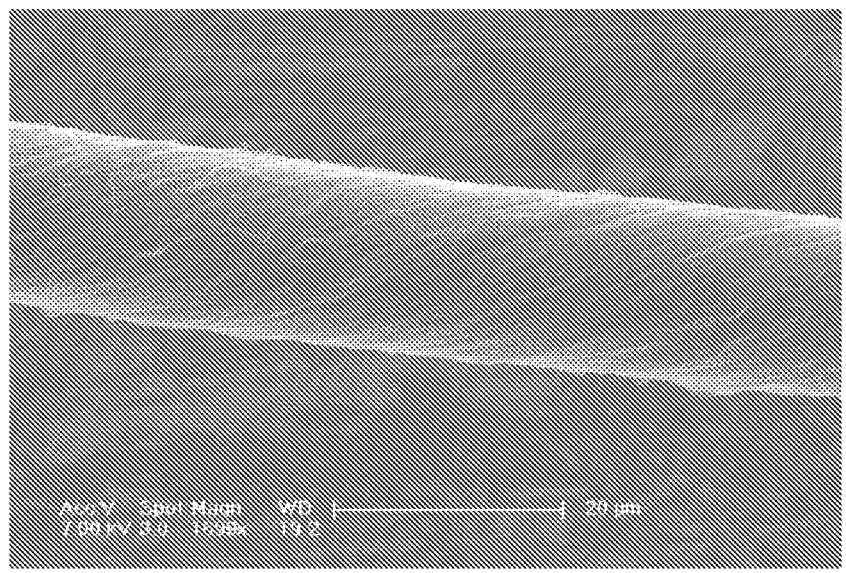
FIG. 10 is an SEM image of a twisted carbon nanotube wire.

The twisted carbon nanotube wire can be formed by twisting a drawn carbon nanotube film using a mechanical force to turn the two ends of the drawn carbon nanotube film in opposite directions. Referring to FIG. 10, the twisted carbon nanotube wire includes a plurality of carbon nanotubes helically oriented around an axial direction of the twisted carbon nanotube wire. More specifically, the twisted carbon nanotube wire includes a plurality of successive carbon nanotube segments joined end to end by van der Waals attractive force therebetween. Each carbon nanotube segment includes a plurality of carbon nanotubes parallel to each other, and combined by van der Waals attractive force therebetween. The length of the carbon nanotube wire can be set as desired. A diameter of the twisted carbon nanotube wire can be from about 0.5 nanometers to about 100 micrometers. Further, the twisted carbon nanotube wire can be treated with a volatile organic solvent after being twisted to bundle the adjacent paralleled carbon nanotubes together. The specific surface area of the twisted carbon nanotube wire will decrease, while the density and strength of the twisted carbon nanotube wire will increase.

The graphene layer 110 can be used as a mask for growing the semiconductor epitaxial layer 104. The mask is the patterned graphene layer 110 sheltering a part of the epitaxial growth surface 101 and exposing another part of the epitaxial growth surface 101. Thus, the semiconductor epitaxial layer 104 can grow from the exposed epitaxial growth surface 101. The graphene layer 110 can form a patterned mask on the epitaxial growth surface 101 because the patterned graphene layer 110 defines a plurality of apertures 112. Compared to lithography or etching, the method of forming a patterned graphene layer 110 as mask is simple, low in cost, and will not pollute the substrate 100.

Furthermore, a buffer layer such as a low-temperature GaN layer, AlN, TiN or SiC layer can be grown on the epitaxial growth surface 101 before step (20). Thus, the quality of the semiconductor epitaxial layer 104 can be improved through this step.

In step (30), the semiconductor epitaxial layer 104 grows via a process of molecular beam epitaxy (MBE), chemical beam epitaxy (CBE), vacuum epitaxy, low temperature epitaxy, choose epitaxy, liquid phase deposition epitaxy (LPE), metal organic vapor phase epitaxy (MOVPE), ultra-high vacuum chemical vapor deposition (UHVCVD), hydride vapor phase epitaxy (HVPE), and metal organic chemical vapor deposition (MOCVD).

The semiconductor epitaxial layer 104 is a layer of single crystal structure growing on the epitaxial growth surface 101. The material of the semiconductor epitaxial layer 104 can be the same as the substrate 100. If the material is the same, the semiconductor epitaxial layer 104 is the homoepitaxial layer, otherwise the semiconductor epitaxial layer 104 is the heteroepitaxial layer. The material of the semiconductor epitaxial layer 104 can be Si, GaAs, GaN, GaSb, InN, InP, InAs, InSb, AlP, AlAs, AlSb, AlN, GaP, CuP, SiC, SiGe, GaMnAs, GaAlAs, GaInAs, GaAlN, GaInN, AlInN, GaAsP, InGaN, AlGaInN, AlGaInP, GaP:Zn, or GaP:N.

The first semiconductor layer 120 and the second semiconductor layer 140 are a doped semiconductor epitaxial layer such as an N-type semiconductor layer or a P-type semiconductor layer. The N-type semiconductor layer is configured to produce electrons and the P-type semiconductor layer is configured to produce holes. The active layer 130 is a photon excitation layer and can be one of a single layer quantum well film or multilayer quantum well films. The material of the quantum well can be indium gallium nitride, indium gallium aluminum nitride, gallium arsenide, aluminum gallium arsenide, indium phosphide, gallium, indium phosphide, arsenic, or indium arsenide and gallium. The first semiconductor layer 120, the active layer 130, and the second semiconductor layer 140 are stacked on the epitaxial growth surface 101. The active layer 130 is sandwiched between the first semiconductor layer 120 and the second semiconductor layer 140.

The thickness of the first semiconductor layer 120 can be in a range from about 0.5 nanometers to about 5 micrometers. For example, the thickness of the first semiconductor layer 120 can be about 10 nanometers, 100 nanometers, 1 micrometer, 2 micrometers, or 3 micrometers. The thickness of the second semiconductor layer 140 can be in a range from about 0.1 micrometers to about 3 micrometers. For example, the thickness of the second semiconductor layer 140 can be about 0.3 micrometers, 1 micrometer, 2 micrometers, or 3 micrometers. The thickness of the active layer 130 can be in a range from about 0.1 micrometers to about 0.5 micrometers. In one embodiment, the thickness of the active layer 130 is about 0.3 micrometers.

In one embodiment, the first semiconductor layer 120 is a Si doped N-type GaN layer, the active layer 130 is a composite layer of InGaN/GaN and the second semiconductor layer 140 is a Mg doped P-type GaN layer. The substrate 100 is sapphire substrate. The semiconductor epitaxial layer 104 is grown on the sapphire substrate by MOCVD method. The semiconductor epitaxial layer 104 is doped via introducing different doped gas into the source gas. The first semiconductor layer 120, the active layer 130 and the second semiconductor layer 140 can grow in series by changing the doped gas and controlling the grow time.

In example, the nitrogen source gas is high-purity ammonia ($NH_3$), the Ga source gas is trimethyl gallium (TMGa) or triethyl gallium (TEGa), the Si source gas is silane ($SiH_4$), the Mg source gas is ferrocene magnesium ($Cp_2Mg$), the In source gas trimethyl indium (TMIn), and the carrier gas is hydrogen ($H_2$) or nitrogen ($N_2$). The growth of the epitaxial layer includes the following steps:

step (301), locating the sapphire substrate 100 with the graphene layer 110 thereon into a reaction chamber, heating the sapphire substrate 100 to about 1100° C. to about 1200° C., introducing the carrier gas, and baking the sapphire substrate for about 200 seconds to about 1000 seconds;

step (302), growing a low-temperature GaN buffer layer with a thickness of about 10 nanometers to about 50 nanometers by cooling down the temperature of the reaction chamber to a range from about 500° C. to 650° C. in the carrier gas atmosphere, and introducing the Ga source gas and the nitrogen source gas at the same time;

step (303), stopping the flow of the Ga source gas while maintaining the flow of the carrier gas and nitrogen source gas atmosphere, increasing the temperature to a range from about 1100° C. to about 1200° C., and annealing for about 30 seconds to about 300 seconds;

step (304), maintaining the temperature of the reaction chamber in a range from about 1000° C. to about 1100° C., and reintroducing the Ga source gas and Si source gas to grow a high quality Si doped N-type GaN epitaxial layer as the first semiconductor layer 120;

step (305), stopping the flow of the Si source gas, changing the temperature of the reaction chamber to about 700° C. to about 900° C., and changing the pressure of the reaction chamber on about 50 Torr to about 500 Torr;

step (306), introducing the In source gas into the reaction chamber to grow multilayer quantum well of InGaN/GaN as the active layer 130 while maintaining temperature and pressure of the reaction chamber in step (305);

step (307), stopping the flow of the In source gas, changing the temperature of the reaction chamber to about 1000° C. to about 1100° C., and changing the pressure of the reaction chamber on about 76 Torr to about 200 Torr; and step (308), introducing the Mg source gas into the reaction chamber to grow a high quality Mg doped P-type GaN epitaxial layer as the second semiconductor layer 140 while maintaining temperature and pressure of the reaction chamber in step (307)

In step (304), the growth of the first semiconductor layer 120 can include the following stages:

stage (3041) growing a plurality of epitaxial crystal nucleus on the epitaxial growth surface 101, and forming from the epitaxial crystal nucleus a plurality of epitaxial crystal grains along the direction substantially perpendicular to the epitaxial growth surface 101;

stage (3042) growing from the plurality of epitaxial crystal grains a continuous epitaxial film along the direction substantially parallel to the epitaxial growth surface 101; and stage (3043) forming the N-type first semiconductor layer 120 by growing continuously the epitaxial film along the direction substantially perpendicular to the epitaxial growth surface 101.

In stage (3041), because the graphene layer 110 is placed on the epitaxial growth surface 101, the epitaxial crystal grains can only grow on the epitaxial growth surface 101 which are exposed out of the graphene layer 110 through the apertures 112. The growth direction of the epitaxial crystal grains is substantially perpendicular to the surface of the epitaxial growth surface 101.

In stage (3042), the epitaxial crystal grains can grow out of the apertures 112 of the graphene layer 110 along the direction substantially parallel to the epitaxial growth surface 101. Thus the epitaxial crystal grains will form an integrated structure such as the epitaxial film. During this process, the epitaxial film defines a patterned depression 122 on the surface adjacent to the epitaxial growth surface 101. The patterned depression 122 is related to the patterned graphene layer 110. If the graphene layer 110 includes a plurality of graphene strips located in parallel with each other and spaced from each other, the patterned depression 122 is a plurality of parallel and spaced grooves. If the graphene layer 110 includes a plurality of graphene strips crossed or weaved together to form a net, the patterned depression 122 is a groove network including a plurality of intersected grooves. The graphene layer 110 can prevent lattice dislocation between the epitaxial crystal grains and the substrate 100 from growing. The process of epitaxial crystal grains growing along the direction substantially parallel to the epitaxial growth surface 101 is called lateral epitaxial growth.

In stage (3043), the dislocation between the epitaxial crystal grains and the substrate 100 will be reduced, and the quality of the epitaxial film will be improved, because of the graphene layer 110. The first semiconductor layer 120 homoepitaxially grows on the epitaxial film, thus the first semiconductor layer 120 includes less defects. Furthermore, the quality of the active layer 130 and the second semiconductor layer 140 in following steps will also be improved.

In step (40), the semiconductor epitaxial layer 104 can be etched by the following steps:

step (401) coating a layer of photo resist uniformly on the semiconductor epitaxial layer 104;

step (402) prebaking the photo resist in a temperature ranging from about 80° C. to about 100° C. for about 20 minutes to about 30 minutes;

step (403) exposing and developing the photo resist;

step (404) baking the photo resist in a temperature ranging from about 100° C. to about 150° C. for about 20 minutes to about 30 minutes;

step (405) corroding the semiconductor epitaxial layer 104 to form a predetermined figure; and step (406) removing the photo resist by immersing the photo resist into a solvent.

The step (403) can further include the following substeps:

step (4031) placing a mask layer on the surface of the semiconductor epitaxial layer 104;

step (042) irradiating the semiconductor epitaxial layer 104 using ultraviolet;

step (4043) immersing the semiconductor epitaxial layer 104 into a developer for about 30 minutes to obtain a patterned photo resist.

In step (50), the first electrode 150 and the second electrode 160 can be an N-type electrode or a P-type electrode. The thickness of the first electrode 150 and the second electrode 160 ranges from about 0.01 micrometers to about 2 micrometers. The material of the first electrode 150 and the second electrode 160 can be titanium (Ti), silver (Ag), aluminum (Al), nickel (Ni), gold (Au), or any combination of them. The material of the first electrode 150 and the second electrode 160 can also be indium-tin oxide (ITO), graphene film or carbon nanotube film. The first electrode 150 can cover the entire surface or a part of the surface of the second semiconductor layer 140. The first electrode 150 and the second electrode 160 can be made by an etching process with a mask layer.

When the material of the first electrode 150 and the second electrode 160 is a metal or alloy, the material can be selected separately according to the semiconductor layer electrically connected with the first electrode 150. Thus the contact resistance will be reduced. The first electrode 150 and the second electrode 160 can be deposited via a process of physical vapor deposition, such as electron beam evaporation, vacuum evaporation, ion sputtering, or any physical deposition. While the light is extracted from the second semiconductor layer 140, the first electrode 150 should only cover a part of the surface of the second semiconductor layer 140. The ratio of the surface of the second semiconductor layer 140 which is covered by the first electrode 150 in a range from about 10% to about 15%. The second electrode 160 covers part of the exposed first semiconductor layer 120.

When the material of the first electrode 150 and the second electrode 160 is ITO, the first electrode 150 and the second electrode 160 can be deposited via magnetron sputtering, evaporation, spraying, or sol-gel method. The first electrode 150 can cover the entire surface of the second semiconductor layer 140, and the second electrode 160 can also cover the entire exposed first semiconductor layer 120.

In one embodiment, the first electrode 150 comprises an Au film of 15 nanometers and a Ti film of 100 nanometers. The second electrode 160 comprises an Au film of 15 nanometers and a Ti film of 200 nanometers.

In another embodiment, the graphene layer 110 can be placed between the first semiconductor layer 120 and the active layer 130 or between the active layer 130 and the second semiconductor layer 140. When the graphene layer 110 is placed on a surface of the active layer 130 adjacent to the first semiconductor layer 120, the first semiconductor layer 120 will form a patterned depression 122 on a surface adjacent to the active layer 130.

The method for making the LED 10 has many advantages. The graphene layer 110 can be directly formed on the substrate 100 to grow a semiconductor epitaxial layer 104. The process is simple and the complex sputtering and etching process is avoided. A plurality of microstructures can also be formed on the semiconductor epitaxial layer 104 by using graphene layer 110 as the mask layer, thereby avoiding any complex etching process. The apertures in the graphene layer 110 and the microstructures are sufficiently small such that the light extraction efficiency is improved.

Figure 11:
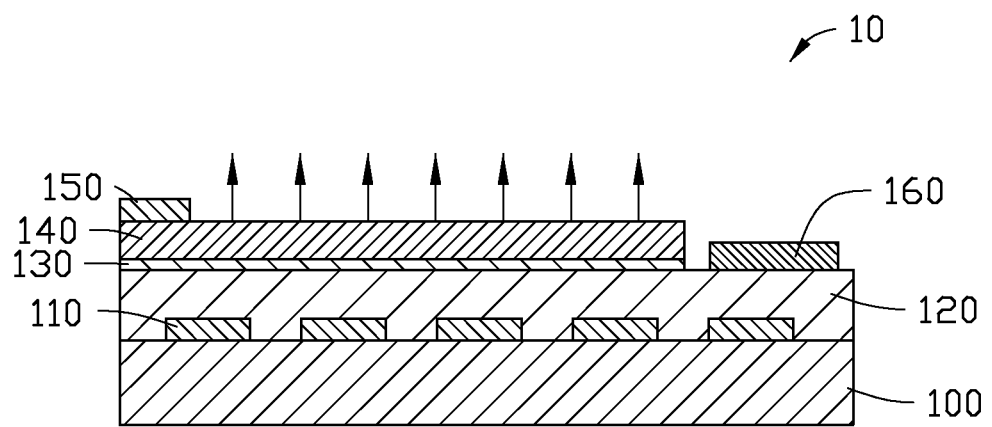
FIG. 11 is a schematic view of a LED fabricated according to the method of FIG. 1.

Referring to FIG. 11, a LED 10 of one embodiment includes a substrate 100, a graphene layer 110, a first semiconductor layer 120, an active layer 130, and a second semiconductor layer 140, a first electrode 150, and a second electrode 160.

The substrate 100 includes an epitaxial growth surface 101. The graphene layer 110 is placed on the epitaxial growth surface 101. The first semiconductor layer 120, the active layer 130, and the second semiconductor layer 140 are stacked on the same side of the epitaxial growth surface 101 in that order. The graphene layer 110 is sandwiched between the first semiconductor layer 120 and the substrate 100. The first electrode 150 is electrically connected with the second semiconductor layer 140. The second electrode 160 is electrically connected with the first semiconductor layer 120.

The graphene layer 110 is a continuous and integrated structure. The graphene layer 110 defines a plurality of apertures 112. The substrate 100 is partly exposed to the semiconductor epitaxial layer 104 from the apertures 112. The first semiconductor layer 120 penetrates the graphene layer 110 through the apertures 112 and connects with the substrate 100. Thus, the first semiconductor layer 120 is located on the substrate 100 through the apertures 112. The surface of the first semiconductor layer 120, which is connected with the substrate 100 has a patterned depression 122 including a plurality of parallel and spaced grooves or a plurality of intersected grooves. The graphene layer 110 is embedded in the patterned depression 122.

In use, the first semiconductor layer 120 is an N-type semiconductor layer configured to provide electrons, and the second semiconductor layer 140 is a P-type semiconductor layer configured to provide holes. The active layer 130 is configured to provide photons. The first electrode 150 and the second electrode 160 are configured to apply a voltage. The first electrode 150 is used as the upper electrode of the LED 10, and the second electrode 160 is used as the lower electrode. When the light excited from the active layer 130 reaches the interface between the first semiconductor layer 120 and the substrate 100 at a sufficiently large incident angle, the light will be scattered. The extracting direction of the light will be changed by the grooves of the patterned depression 122 and the graphene layer 110, thus the light can be extracted from the LED 10, and the light extraction efficiency will be improved.

Figure 12:
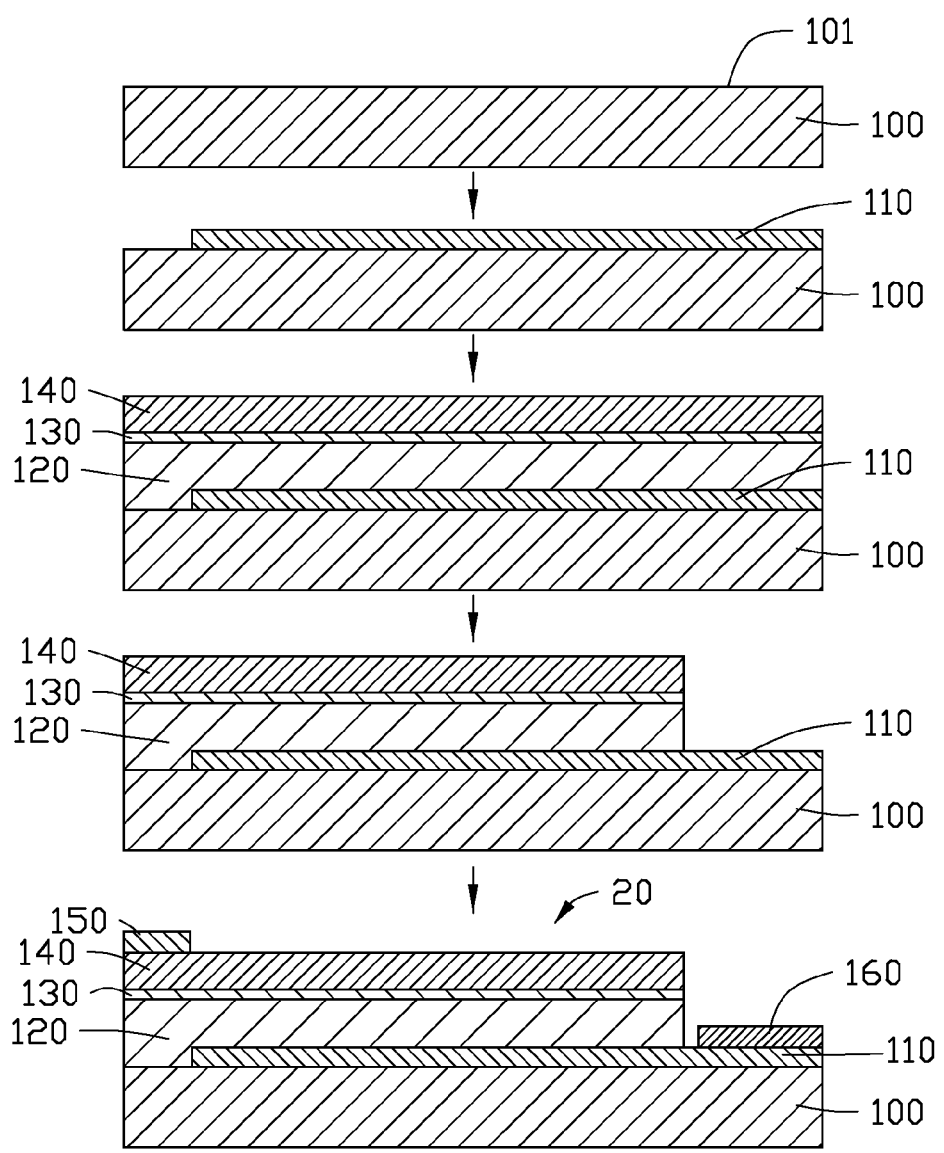
FIG. 12 is a flowchart of another embodiment a method for manufacturing a LED.

Referring to FIG. 12, a method for manufacturing a LED 20 includes the following steps:

step (10A), providing a substrate 100 having an epitaxial growth surface 101;

step (20A), applying a graphene layer 110 on the epitaxial growth surface 101;

step (30A), growing a semiconductor epitaxial layer 104 including a first semiconductor layer 120, an active layer 130 and a second semiconductor layer 140;

step (40A), exposing a part of the graphene layer 110 by etching the semiconductor epitaxial layer 104; and step (50A), applying a first electrode 150 on the second semiconductor layer 140 and a second electrode 160 on the exposed part of the graphene layer 110.

The method for manufacturing the LED 20 is similar to the method for manufacturing the LED 10 above except that part of the graphene layer 110 is exposed in step (40A) and the second electrode 160 is electrically connected with the exposed part of the graphene layer 110 in step (50A).

Figure 13:
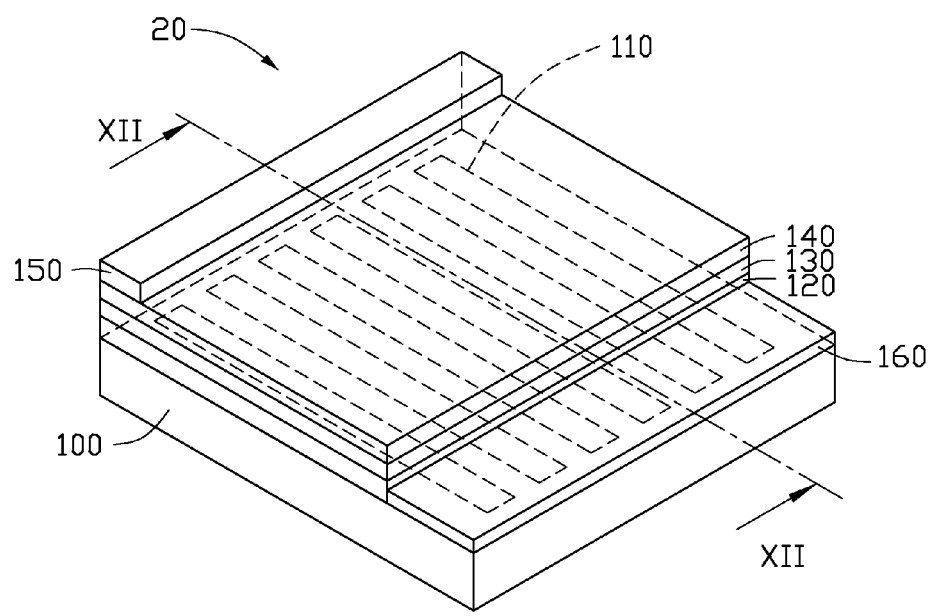
FIG. 13 is a three-dimensional view a LED fabricated according to the method of FIG. 12.
Figure 14:
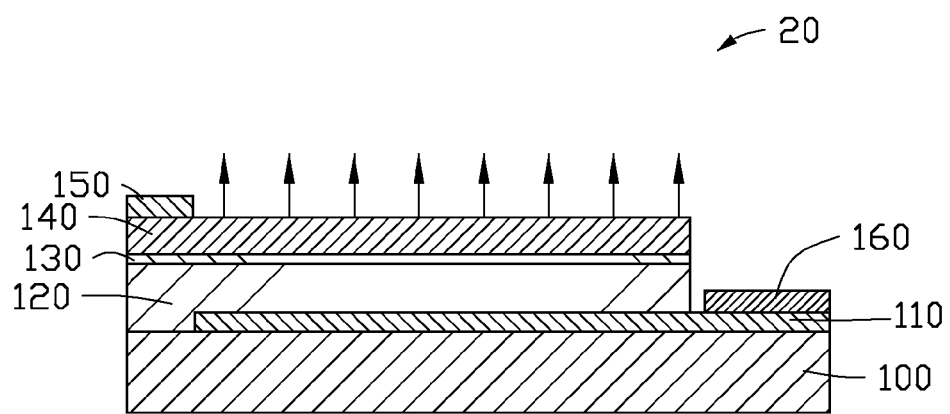
FIG. 14 is a schematic, cross-sectional view, along a line XIV-XIV of FIG. 13.

Referring to FIGS. 13 and 14, a LED 20 of one embodiment includes a substrate 100, a graphene layer 110, a first semiconductor layer 120, an active layer 130, and a second semiconductor layer 140, a first electrode 150, and a second electrode 160.

The LED 20 is similar to the LED 10 above except that the second electrode 160 is electrically connected with the exposed part of the graphene layer 110. The graphene layer 110 is electrically connected to the first semiconductor layer 120. Because the excellent conductivity of the graphene layer 110, the graphene layer 110 and second electrode 160 can be used as the lower electrode of the LED 20 together. The first electrode 150 is used as the upper electrode of the LED 20. In one embodiment, the graphene layer 110 includes a plurality of graphene strips with each having part exposed from the semiconductor epitaxial layer 104. The second electrode 160 is electrically connected to each of the plurality of graphene strips. The second electrode 160 can be omitted and the graphene layer 110 can be used as the lower electrode of the LED 20 directly because of the excellent conductivity of the graphene layer 110.

When applying a voltage between the first electrode 150 and the second electrode 160, the current flows from the upper electrode to the lower electrode vertically. Thus the LED 20 forms in a vertical structure LED. The light can be extracted from the second semiconductor layer 140. If the first electrode 150 is transparent, the first electrode 150 can cover the entire surface of the second semiconductor layer 140.

Figure 15:
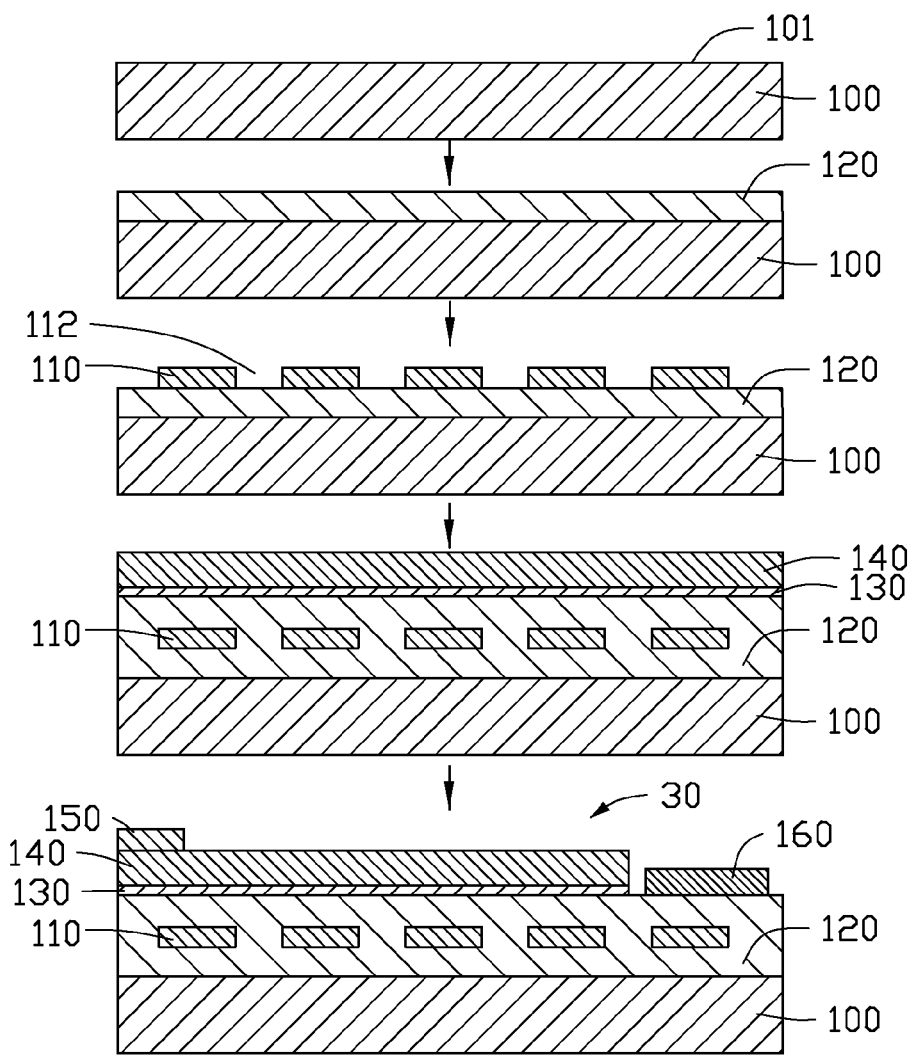
FIG. 15 is a flowchart of yet another embodiment a method for manufacturing a LED.

Referring to FIG. 15, a method for manufacturing a LED 30 includes the following steps:

step (10B), providing a substrate 100 having an epitaxial growth surface 101;

step (20B), growing a first semiconductor layer 120 on the epitaxial growth surface 101;

step (30B), applying a graphene layer 110 on the first semiconductor layer 120;

step (40B), growing the first semiconductor layer 120 again to enclose the graphene layer 110, and growing an active layer 130 and a second semiconductor layer 140 on the first semiconductor layer 120;

step (50B), exposing a part of the first semiconductor layer 120 by etching the semiconductor epitaxial layer 104; and step (60B), applying a first electrode 150 on the second semiconductor layer 140 and a second electrode 160 on the exposed part of the first semiconductor layer 120.

The method for manufacturing the LED 30 is similar to the method for manufacturing the LED 10 above except that the first semiconductor layer 120 is grown by two steps so that the graphene layer 110 is enclosed in the first semiconductor layer 120. In another embodiment, the graphene layer 110 can be enclosed in the second semiconductor layer 140.

Figure 16:
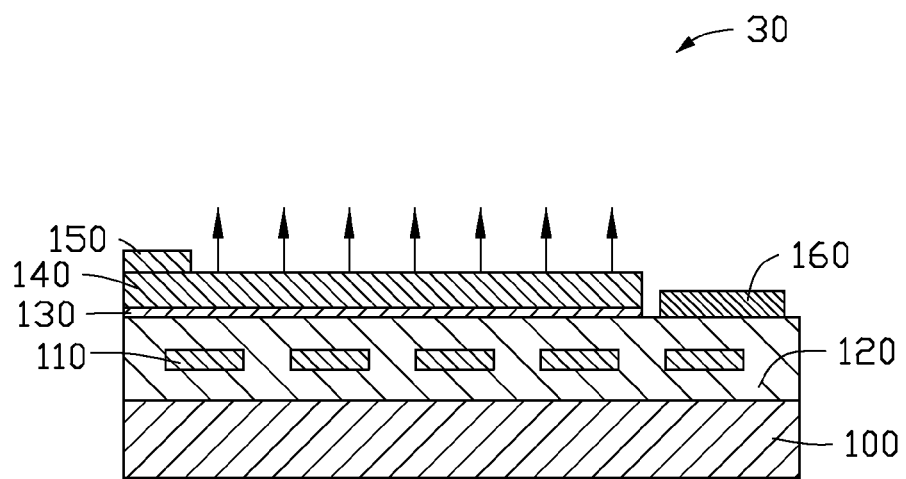
FIG. 16 is a schematic view of a LED fabricated according to the method of FIG. 15.

Referring to FIG. 16, a LED 30 of one embodiment includes a substrate 100, a graphene layer 110, a first semiconductor layer 120, an active layer 130, and a second semiconductor layer 140, a first electrode 150, and a second electrode 160.

The LED 30 is similar to the LED 10 above except that the graphene layer 110 is enclosed in the first semiconductor layer 120. The first semiconductor layer 120 has a plurality of chambers 124 and the graphene layer 110 is located in the plurality of chambers 124. In another embodiment, the graphene layer 110 can be enclosed in the second semiconductor layer 140.

Figure 17:
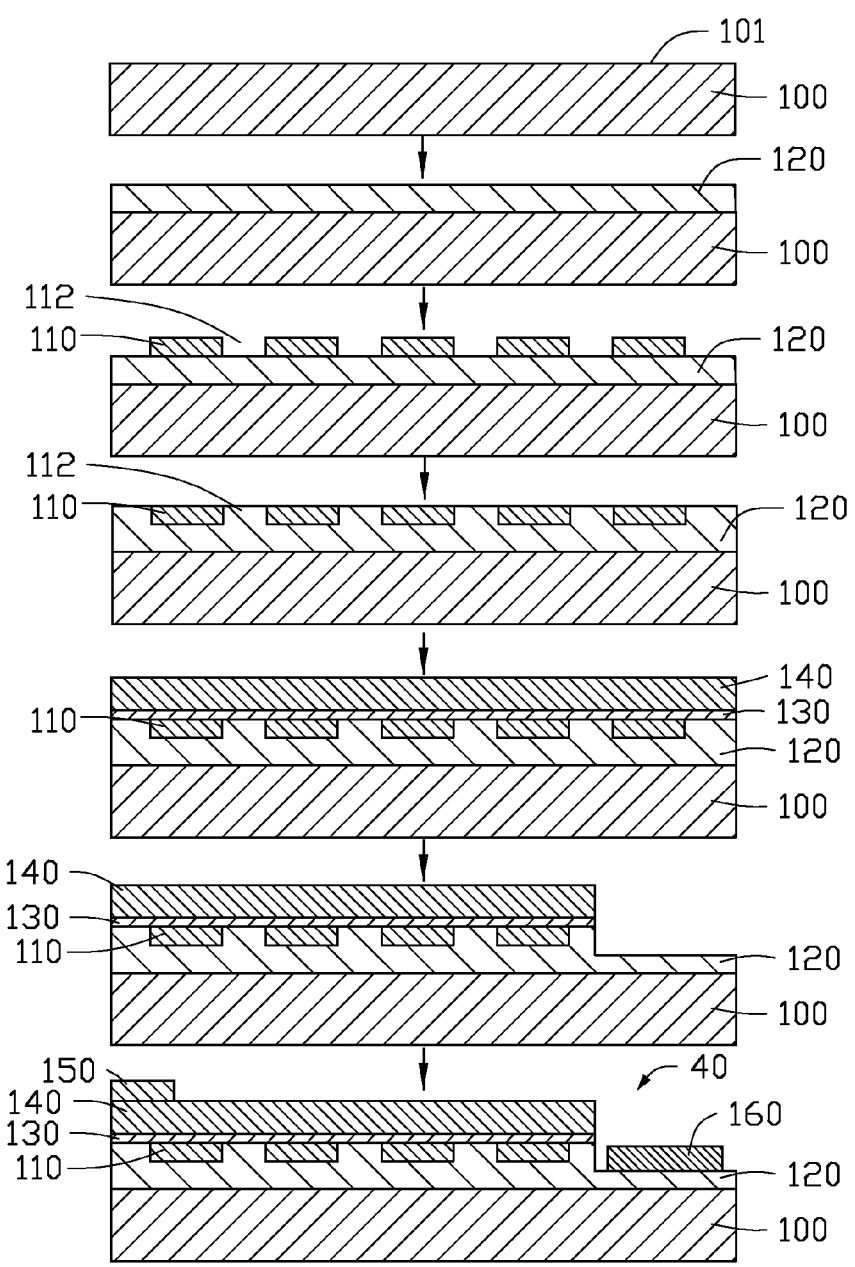
FIG. 17 is a flowchart of yet another embodiment a method for manufacturing a LED.

Referring to FIG. 17, a method for manufacturing a LED 40 includes the following steps:

step (10C), providing a substrate 100 having an epitaxial growth surface 101;

step (20C), growing a first semiconductor layer 120 on the epitaxial growth surface 101;

step (30C), applying a graphene layer 110 on the first semiconductor layer 120;

step (40C), growing the first semiconductor layer 120 to semi-enclose the graphene layer 110;

step (50C), growing an active layer 130 and a second semiconductor layer 140 on the first semiconductor layer 120;

step (60C), exposing a part of the first semiconductor layer 120 by etching the semiconductor epitaxial layer 104; and step (70C), applying a first electrode 150 on the second semiconductor layer 140 and a second electrode 160 on the exposed part of the first semiconductor layer 120.

The method for manufacturing the LED 40 is similar to the method for manufacturing the LED 10 above except that the first semiconductor layer 120 only semi-enclose the graphene layer 110 by controlling the growing time in step (40C). That is, a patterned depression 122 is formed on the first semiconductor layer 120 so that the graphene layer 110 is embedded in the depression 122 of the first semiconductor layer 120. In another embodiment, the depression 122 can be formed on a surface of the second semiconductor layer 140 away from the active layer 130, and the graphene layer 110 can be embedded in the depression 122 of the second semiconductor layer 140. The second electrode 160 in not in contact with the graphene layer 110.

Figure 18:
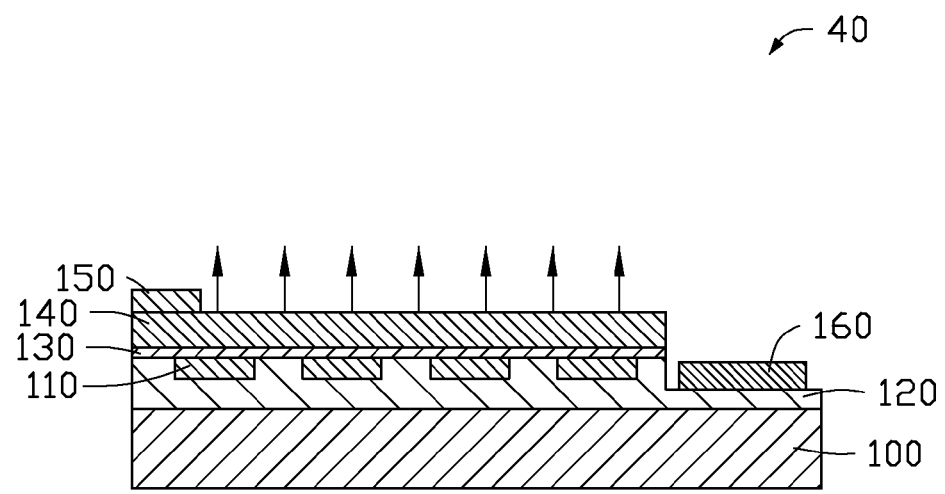
FIG. 18 is a schematic view of a LED fabricated according to the method of FIG. 17.

Referring to FIG. 18, a LED 40 of one embodiment includes a substrate 100, a graphene layer 110, a first semiconductor layer 120, an active layer 130, and a second semiconductor layer 140, a first electrode 150, and a second electrode 160.

The LED 40 is similar to the LED 10 above except that the graphene layer 110 is located on a surface of the first semiconductor layer 120 adjacent to the active layer 130. The first semiconductor layer 120 and the active layer 130 define a plurality of chambers 124 and the graphene layer 110 is located in the plurality of chambers 124. In another embodiment, the graphene layer 110 can be located on a surface of the second semiconductor layer 140 away from the active layer 130. The semiconductor layer 140 has a patterned depression 122 on the surface away from the active layer 130. The graphene layer 110 is embedded in the depression 122 of the second semiconductor layer 140. The first electrode 150 can be omitted and the graphene layer 110 can be used as the upper electrode of the LED 40 directly because of the excellent conductivity of the graphene layer 110.

Depending on the embodiment, certain of the steps of methods described may be removed, others may be added, and the sequence of steps may be altered. The description and the claims drawn to a method may include some indication in reference to certain steps. However, the indication used is only to be viewed for identification purposes and not as a suggestion as to an order for the steps.

The above-described embodiments are intended to illustrate rather than limit the disclosure. Variations may be made to the embodiments without departing from the spirit of the disclosure as claimed. Any element of any one embodiment is considered to be disclosed to be incorporated with any other embodiment. The above-described embodiments illustrate the scope of the disclosure but do not restrict the scope of the disclosure.

What is claimed is:

1. A light emitting diode, comprising:
a substrate comprising an epitaxial growth surface;
a semiconductor epitaxial layer on the epitaxial growth surface of the substrate, wherein the semiconductor epitaxial layer comprises a first semiconductor layer, an active layer, and a second semiconductor layer, the active layer is between the first semiconductor layer and the second semiconductor layer, the first semiconductor layer comprises a first surface and a second surface opposite to the first surface, the first surface is in direct contact with the epitaxial growth surface of the substrate, and the second surface is in direct contact with the active layer;
a first electrode electrically connected with the second semiconductor layer;
a second electrode in direct and electrical contact with the first semiconductor layer, wherein the second electrode and the substrate are located on two opposite surfaces of the first semiconductor layer; and
a first graphene layer located between the active layer and the first semiconductor layer, wherein the first graphene layer defines a plurality of first apertures and is spaced from the second electrode, the first semiconductor layer defines a patterned depression on the second surface, the first graphene layer is embedded in the patterned depression, and the first semiconductor layer is in direct contact with the active layer by partially extending the first semiconductor layer through the plurality of first apertures.

2. The light emitting diode of claim 1, wherein the first graphene layer is a structure consisting of graphene.

3. The light emitting diode of claim 1, wherein a thickness of the first graphene layer is in a range from about 1 nanometer to about 100 micrometers.

4. The light emitting diode of claim 1, wherein the first graphene layer comprises a graphene film consisting of a single layer of continuous carbon atoms.

5. The light emitting diode of claim 4, wherein the first graphene layer has a thickness of a thickness of a single layer of carbon atoms.

6. The light emitting diode of claim 1, wherein the first graphene layer is a coating comprising graphene powder.

7. The light emitting diode of claim 1, wherein the first graphene layer is sizes of the plurality of first apertures are in a range from about 10 nanometers to about 500 micrometers.

8. The light emitting diode of claim 7, wherein the sizes of the plurality of first apertures are in a range from about 10 nanometers to about 10 micrometers.

9. The light emitting diode of claim 1, wherein a dutyfactor of the first graphene layer is in a range from about 1:100 to about 100:1, wherein the dutyfactor is an area ratio between a covered area to an exposed area of the epitaxial growth surface.

10. The light emitting diode of claim 9, wherein the dutyfactor of the first graphene layer is in a range from about 1:4 to about 4:1.

11. The light emitting diode of claim 1, wherein the first electrode and the second electrode are all electrodes of the light emitting diode.

12. The light emitting diode of claim 1, wherein the active layer is a photon excitation layer configured to provide photons.

13. The light emitting diode of claim 1, wherein a thickness of the first graphene layer is substantially the same as a depth of the patterned depression.

14. The light emitting diode of claim 1, wherein the first graphene layer comprises a plurality of graphene strips crossed or weaved together to form a net, and the patterned depression is a groove network comprising a plurality of intersected grooves.

15. A light emitting diode, comprising:
a substrate comprising an epitaxial growth surface;
a first semiconductor layer located on the epitaxial growth surface, wherein the first semiconductor layer comprises a first surface in direct contact with the epitaxial growth surface and a second surface opposite to the first surface, and the first semiconductor layer defines a patterned depression on the second surface;
an active layer located on the second surface, wherein the active layer comprises a third surface in direct contact with the second surface;
a second semiconductor layer located on the active layer, wherein the active layer is between the first semiconductor layer and the second semiconductor layer;
a first electrode electrically connected with the second semiconductor layer;
a second electrode electrical contact with the first semiconductor layer; and
a graphene layer embedded in the patterned depression and located between the active layer and the first semiconductor layer, wherein the graphene layer defines a plurality of apertures, and the first semiconductor layer is in direct contact with the active layer by partially extending the first semiconductor layer through the plurality of apertures.

16. The light emitting diode of claim 15, wherein a thickness of the graphene layer is substantially the same as a depth of the patterned depression.

17. The light emitting diode of claim 15, wherein the graphene layer comprises a plurality of graphene strips crossed or weaved together, and the patterned depression comprises a plurality of intersected grooves.

* * * * *